(12) United States Patent
Chu et al.

(10) Patent No.: US 6,820,684 B1
(45) Date of Patent: Nov. 23, 2004

(54) COOLING SYSTEM AND COOLED ELECTRONICS ASSEMBLY EMPLOYING PARTIALLY LIQUID FILLED THERMAL SPREADER

(75) Inventors: Richard C. Chu, Hopewell Junction, NY (US); Micheal J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/606,588

(22) Filed: Jun. 26, 2003

(51) Int. Cl.[7] ............................................. F28D 15/00
(52) U.S. Cl. ........................... 165/104.33; 165/104.21; 165/80.3; 361/700; 257/715; 174/15.2; 174/16.3
(58) Field of Search ..................... 165/104.21, 104.26, 165/104.33, 185; 361/700; 174/15.2; 257/714–716

(56) References Cited

U.S. PATENT DOCUMENTS

| | | | | |
|---|---|---|---|---|
| 4,572,286 A | * | 2/1986 | Fujii et al. ............. | 165/104.29 |
| 4,796,155 A | * | 1/1989 | Saito et al. .................. | 361/700 |
| 5,308,920 A | * | 5/1994 | Itoh .......................... | 174/15.2 |
| 5,390,077 A | * | 2/1995 | Paterson ..................... | 361/700 |
| 5,411,077 A | * | 5/1995 | Tousignant ............ | 165/104.33 |
| 5,864,466 A | | 1/1999 | Remsburg ................... | 361/700 |
| 6,034,872 A | | 3/2000 | Chrysler et al. ............ | 361/699 |
| 6,064,572 A | | 5/2000 | Remsburg ................... | 361/700 |
| 6,082,443 A | | 7/2000 | Yamamoto et al. ..... | 165/104.26 |
| 6,167,948 B1 | | 1/2001 | Thomas ................. | 165/104.26 |
| 6,213,194 B1 | | 4/2001 | Chrysler et al. ........... | 165/80.3 |
| 6,223,810 B1 | | 5/2001 | Chu et al. .............. | 165/104.33 |
| 6,227,287 B1 | * | 5/2001 | Tanaka et al. ............. | 165/80.4 |
| 6,269,866 B1 | | 8/2001 | Yamamoto et al. ..... | 165/104.26 |
| 6,302,192 B1 | | 10/2001 | Dussinger et al. ..... | 165/104.26 |
| 6,366,462 B1 | | 4/2002 | Chu et al. .................... | 361/699 |
| 6,397,618 B1 | | 6/2002 | Chu et al. ................... | 62/259.2 |
| 6,550,531 B1 | * | 4/2003 | Searls et al. ........... | 165/104.33 |
| 6,681,843 B2 | * | 1/2004 | Sugito .................... | 165/104.33 |

FOREIGN PATENT DOCUMENTS

| | | | | |
|---|---|---|---|---|
| JP | 57-068060 | * | 4/1982 | ............ 165/104.33 |
| JP | 58-083184 | * | 5/1983 | ............ 165/104.21 |
| JP | 59-232448 | * | 12/1984 | ................. 257/715 |
| JP | 2001-024374 | | 1/2001 | ............ H05K/7/20 |
| WO | WO 98/22767 | | 5/1998 | ........... F28D/15/00 |

OTHER PUBLICATIONS

"Two Stage Cooling System Employing Thermoelectric Modules," Chu et al., Ser. No. 10/115,903, filed Apr. 4, 2002.

\* cited by examiner

*Primary Examiner*—Terrell McKinnon
(74) *Attorney, Agent, or Firm*—Andrew J. Wojnicki, Esq.; Kevin P. Radigan, Esq.; Heslin Rothenberg Farley & Mesiti, P.C.

(57) ABSTRACT

A cooling system and method, and a cooled electronics assembly are provided employing a thermal spreader having an inner chamber evacuated and partially filled with a liquid. A phase separator is disposed within the thermal spreader to at least partially divide the inner chamber into a boiling section and a condensing section, while allowing vapor and liquid to circulate between the sections. A heat extraction assembly is disposed at least partially within the inner chamber to extract heat therefrom. When the thermal spreader is coupled to a heat generating component with the boiling section disposed adjacent thereto, liquid within the thermal spreader boils in the boiling section, producing vapor which flows upward from the boiling section and causes liquid to flow into the boiling section from the condensing section, thereby providing circulatory flow between the sections and facilitating removal of heat from the heat generating component.

30 Claims, 3 Drawing Sheets

COOLING SYSTEM AND COOLED ELECTRONICS ASSEMBLY EMPLOYING PARTIALLY LIQUID FILLED THERMAL SPREADER

TECHNICAL FIELD

The present invention relates in general to cooling assemblies and other apparatus used for removing heat from electronics devices and modules. More particularly, the present invention relates to an enhanced cooling system and method employing a thermal spreader having an inner chamber at least partially filled with a liquid for facilitating cooling of a heat generating component in, for example, an electronics device or module, such as a computer system component or other electronics system component requiring cooling.

BACKGROUND OF THE INVENTION

As is well known, as the circuit density of electronic chip devices increases in order to achieve faster and faster processing speed, there is a correspondingly increasing demand for the removal of heat generated by these devices. The increased heat demand arises both because the circuit devices are packed more closely together and because the circuits themselves are operated at increasingly higher clock frequencies. Nonetheless, it is also known that runaway thermal conditions and excessive heat generated by chips is a leading cause of failure of chip devices. Furthermore, it is anticipated that demand for heat removal from these devices will increase indefinitely. Accordingly, it is seen that there is a large and significant need to provide useful cooling mechanisms for electronic circuit devices.

Each new generation of computers continues to offer increased speed and function. In most cases, this has been accomplished by a combination of increased power dissipation and increased packaging density. The net result has been increased heat flux at all levels of packaging. For example, there has been an increase in heat flux at the electronics module level which makes it increasingly difficult to remove heat by simple air cooling.

Therefore, there is a need to further enhance cooling systems for more efficient cooling of electronics devices, electronics modules and other heat generating components of, for example, computer systems and other electronic systems.

SUMMARY OF THE INVENTION

The needs of the prior art are addressed, and additional advantages are provided, by the present invention which in one aspect is a cooling system which includes a thermal spreader having an inner chamber at least partially filled with a liquid. Within the inner chamber is disposed a phase separator that at least partially divides the inner chamber into a boiling section and a condensing section, and which allows vapor and liquid to circulate between the boiling section and the condensing section. A heat extraction assembly is disposed at least partially within the inner chamber of the thermal spreader to extract heat therefrom, thereby facilitating condensing of vapor within the inner chamber to liquid. When the thermal spreader of the cooling system is coupled to a heat generating component, with the boiling section thereof disposed adjacent to the heat generating component, liquid within the thermal spreader boils in the boiling section, producing vapor which leaves the boiling section and causes liquid to flow into the boiling section from the condensing section, thereby providing circulatory flow between the boiling section and the condensing section, and facilitating removal of heat from the heat generating component.

In another aspect, a cooled electronics assembly is provided. This assembly includes an electronics device or module having a main surface and a cooling system coupled thereto. The cooling system includes a thermal spreader having an inner chamber at least partially filled with a liquid, and a phase separator that at least partially divides the inner chamber into a boiling section and a condensing section. The phase separator allows vapor and liquid to circulate between the boiling section and the condensing section. A heat extraction assembly is disposed at least partially within the inner chamber of the thermal spreader to extract heat therefrom, and thereby facilitate condensing of vapor within the inner chamber to liquid. The boiling section of the thermal spreader is disposed adjacent to the electronics device or module and liquid within the thermal spreader boils in the boiling section with operation of the electronics device or module. This boiling of the liquid produces vapor which leaves the boiling section and causes liquid to flow into the boiling section from the condensing section, thereby providing circulatory vapor and liquid flow between the boiling section and the condensing section and facilitating removal of heat from the electronics device or module.

Methods of fabricating a cooling system for a heat generating component, and methods for cooling an electronics device or module are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "electronics module" comprises any heat generating component in, for example, a computer system or other electronics system requiring cooling. The heat generating component may be, for example, one or more integrated circuit devices, or one or more packaged electronics devices.

Figure 1:
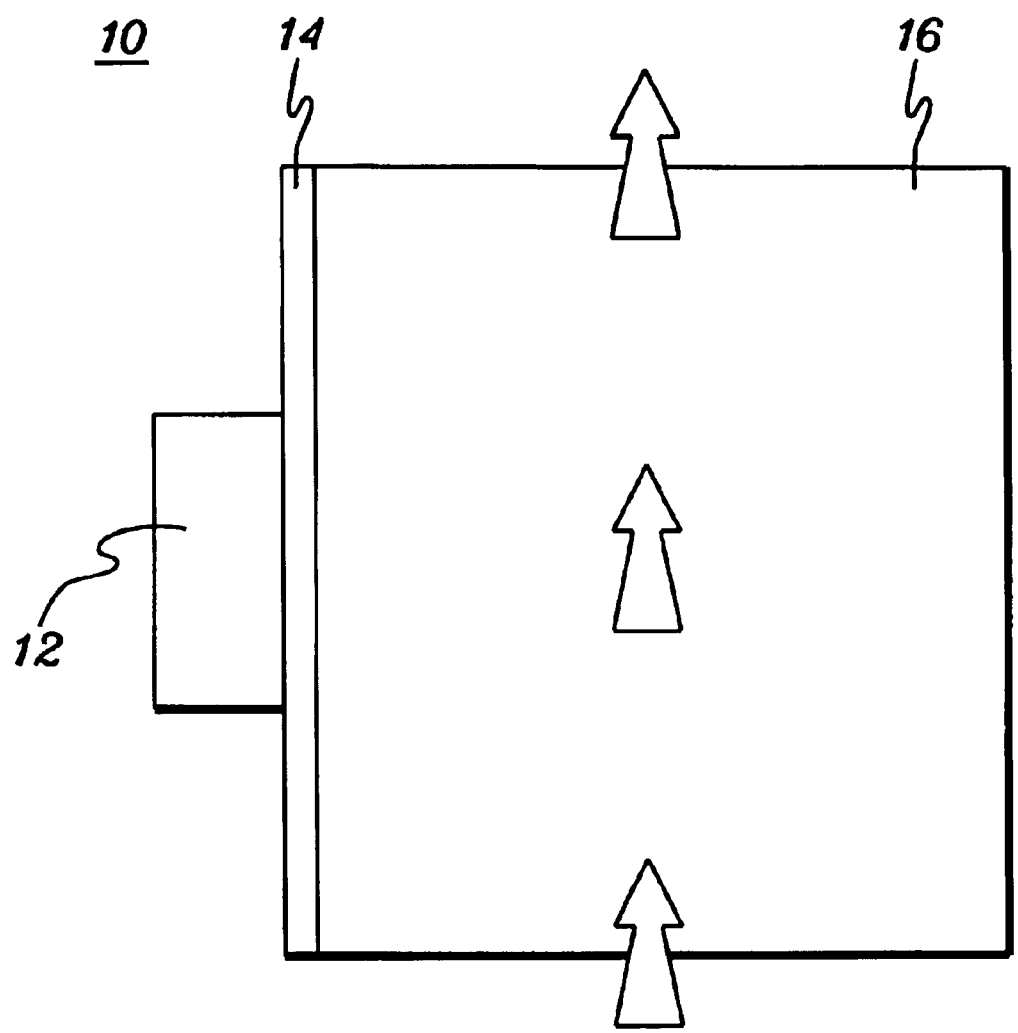
FIG. 1 depicts one embodiment of a conventional cooling system comprising direct air cooling of a finned plate coupled to an electronics module.

To accommodate the increased heat flux from today's electronics modules, forced air-cooled fin heat sinks have been employed to provide a cooled electronic assembly, generally denoted 10, such as shown in FIG. 1. The heat sink, which is coupled to an electronics module 12, includes a thermally conductive base plate 14 to which one or more fins 16 are attached. An air flow (shown by arrows) is established across fins 16 to further facilitate heat transfer. The finned heat sink of FIG. 1 provides increased heat transfer area and thereby reduces the heat flux to the air. In certain cases, to achieve the desired reduction in heat flux, it has been necessary to use a heat sink larger than the planform area of the electronics module (as shown in FIG. 1). In such cases, the heat entering the base of the heat sink from the back of the electronics module must spread radially outward by thermal conduction in base 14 of the heat sink in order to reach the finned area beyond the boundary of electronics module 12. For thermal conduction to take place, the temperature in the base region attached to the electronics module must rise in temperature above that of the base region(s) beyond the confines of the electronics module. This additional temperature rise, above that which would be present if the heat could be uniformly distributed over the entire base of the heat sink, is directly reflected in increased chip temperatures within the electronics module. The increased chip temperatures are a manifestation of the increased temperature potential needed to overcome the thermal spreading resistance in the base of the heat sink.

Generally stated, this problem of thermal spreading in the base of an air cooled heat sink for an electronics module or other heat generating component, is addressed by the cooling system disclosed herein. A cooling system in accordance with one aspect of the present invention includes a thermal spreader which has a relatively thin sealed inner chamber with defined boiling and condensing sections to provide superior heat transfer spreading from a heat source (e.g., an electronics module) to a heat extraction assembly, such as an array of air cooled pin fins. The thermal spreader platform can be significantly larger than that of the electronics module from which heat is being extracted.

Figure 2A:
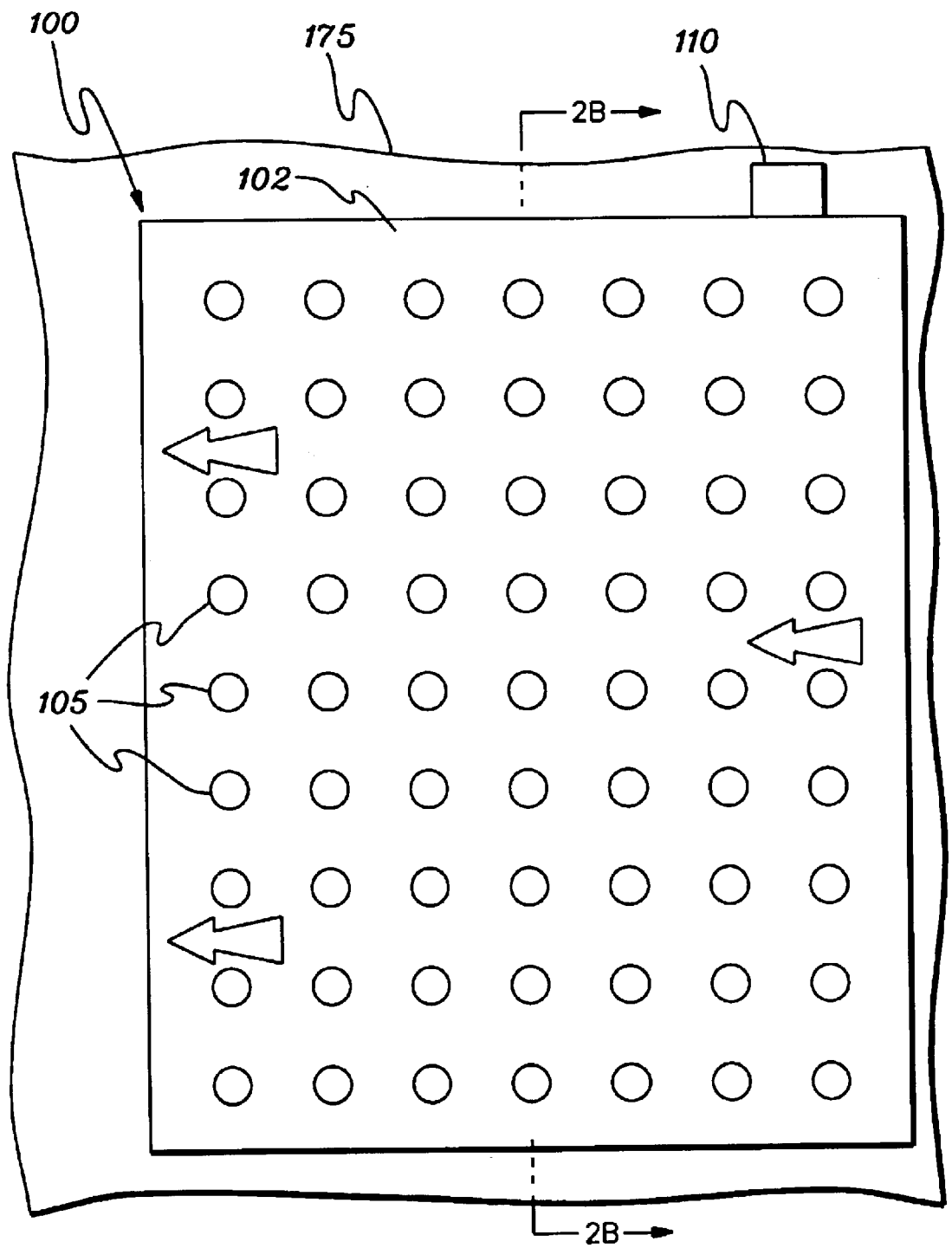
FIG. 2A depicts an elevational view of one embodiment of a cooled electronics assembly comprising a cooling system having a thermal spreader with a plurality of heat ejection pin fins extending from a surface thereof, in accordance with an aspect of the present invention.

FIG. 2A depicts one embodiment of a cooled electronics assembly having a thermal spreader 100, in accordance with an aspect of the present invention. In this example, thermal spreader 100 is coupled to an electronics module 170 (see FIG. 2B) which is connected to a circuit board 175. Thermal spreader 100 is shown to comprise a rectangular structure (as one example) having a main surface 102 from which an array of heat ejection pin fins 105 extend. Although shown as an in line array of pin fins, a staggered array could also be employed. Also, although cylindrical pin fins 105 are shown with a circular cross section in the example of FIG. 2A, the pin fins can be of any desired cross-sectional configuration, including hexagonal, square, rectangular, quadralateral or other desired configuration. Advantageously, pin fins allow air flow, shown by the arrows in FIG. 2A to be from right to left, in any desired direction. For example, air flow direction could be from the bottom to the top, or at some arbitrary angle to the Cartesian grid pattern formed by the array of pin fins. Still further, if desired, an impinging air flow parallel to the longitudinal access of the pin fins could be employed. Any air moving device could be employed to establish the desired air flow.

Figure 2B:
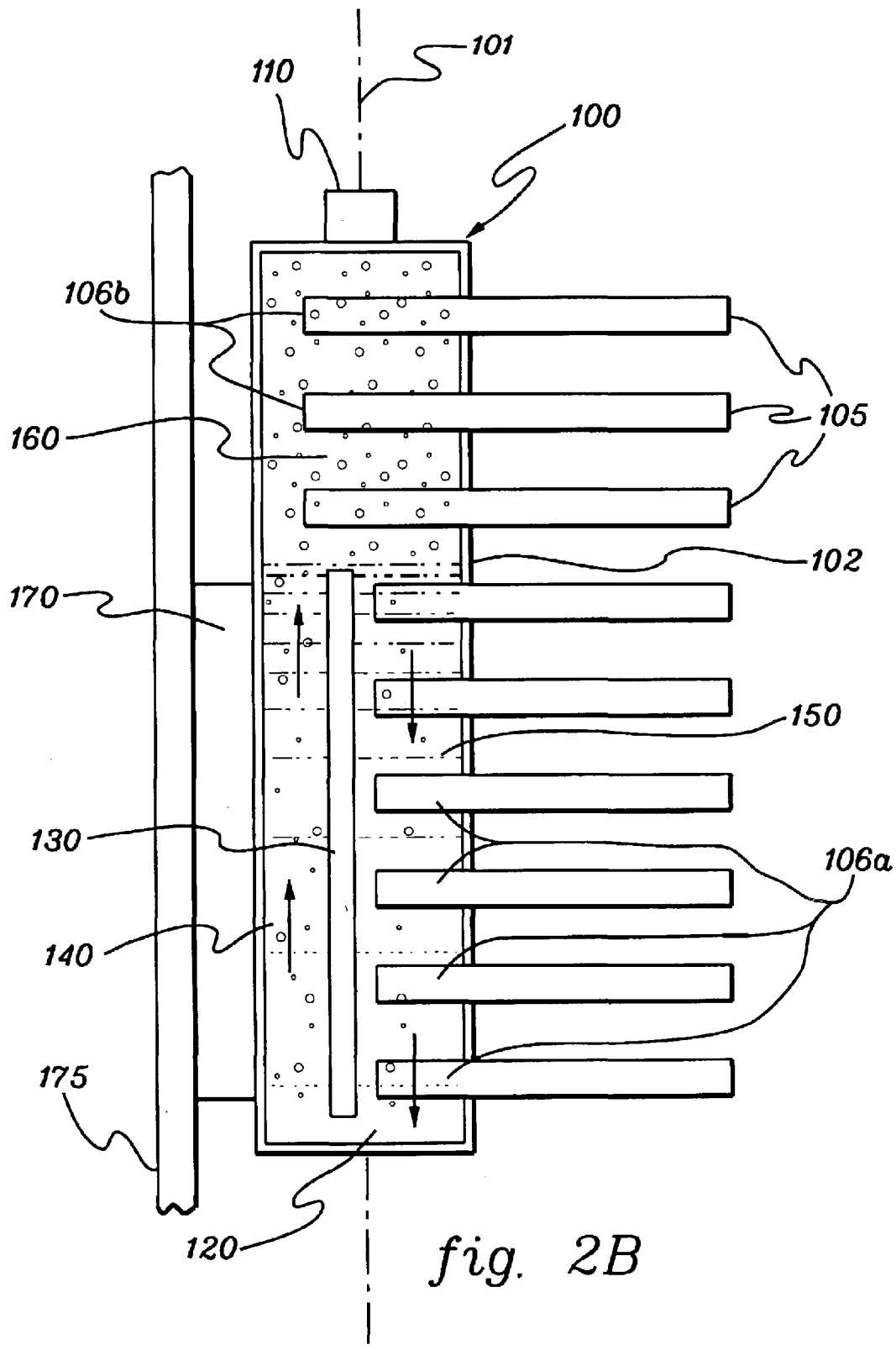
FIG. 2B is a cross-sectional elevational view of the cooled electronics assembly of FIG. 2A taken along line 2B—2B, and showing the thermal spreader with an inner chamber partially filled with liquid, and a phase separator dividing the inner chamber into a boiling section and a condensing section, in accordance with an aspect of the present invention.

FIG. 2B depicts a side-elevational view of the cooled electronics assembly, employing a cooling system in accordance with an aspect of the present invention. The cooling system includes thermal spreader 100 having an inner chamber at least partially filled with a liquid 120. Filling of the inner chamber can be through a fill plug 110, shown at the top of the thermal spreader in the example of FIG. 2B. Thermal spreader 100 has a center access 101 oriented vertically, or substantially vertically (e.g., within a range of plus or minus 10° from a true vertical orientation). This allows gravity to assist with a vertical circulation of vapor and liquid within the chamber, as explained further below.

A phase separator 130 is disposed within the inner chamber to at least partially divide the inner chamber into a boiling section 140 and a condensing section 150, both of which are also vertically oriented. Phase separator 130 could comprise a thin metal or plastic plate, which is sized and positioned to allow vapor and liquid to circulate between boiling section 140 and condensing section 150 as shown by the arrows in FIG. 2B.

A thermally conductive wall of thermal spreader 100 on the boiling section side of the inner chamber is maintained in good thermal contact with a surface of an electronics module 170, or other heat generating component, by mechanical or other suitable means. Thermally conductive grease or other means can be provided to enhance the thermal interface between the inner chamber and the electronics module. Electronics module 170, in this example, is shown mounted to a printed circuit board 175.

A vapor expansion section 160 comprises an upper portion of the inner chamber and functions to facilitate condensation of vapor into liquid. A heat extraction assembly is provided and disposed at least partially within the inner chamber of thermal spreader 100 to extract heat therefrom. By extracting heat from the inner chamber, the heat extraction assembly facilitates condensing of vapor within the inner chamber to liquid. In the example shown, the heat extraction assembly includes the array of heat ejection pin fins 105 extending from outer surface 102 of thermal spreader 100, as well as a plurality of pin fins 106a & 106b in condensing section 150 and vapor expansion section 160, respectively. As shown, pin fins 106a & 106b may have different lengths in the condensing section and the vapor expansion section. In the example shown, each pin fin 106a & 106b may comprise a continuous pin fin extending outside of thermal spreader 100, thereby becoming a corresponding heat ejection pin fin 105. However, other embodiments are possible. For example, pin fins 106a & 106b could be separately manufactured and then structurally connected to the heat ejection pin fins 105 to form a single integrated unit. Further, although shown as continuous pin fins, pin fins 106a & 106b could have different patterns or different sizes, shapes, etc. than pin fins 105 extending from the thermal spreader. Pin fins 106a & 106b within the inner chamber facilitate removal of heat from the inner chamber and provide additional surface area to facilitate condensing of vapor within the inner chamber into liquid.

Set up and operation of the cooling system are next described.

Prior to use of the cooling system, the inner chamber is evacuated through the fill plug/opening 110 at the top of the chamber, then partially backfilled with a liquid, such as water, a fluorocarbon liquid, or even a refrigerant, to a level above the top of the phase separator plate 130, then sealed. By evacuating the chamber and partially backfilling with liquid: (1) the fluid (liquid plus vapor) within the chamber is at saturation conditions, thereby allowing the liquid to boil at temperatures just above room temperature (e.g., 30° C. to 60° C.); and (2) non-condensible gases (e.g., air) are removed that would otherwise impede the condensation process. In one embodiment where water is the liquid being used, the chamber will be at subatmospheric pressure. Vapor expansion space 160 is provided at the top of the chamber to limit pressure changes arising from expansion or contraction of the liquid due to any temperature changes.

As power is applied to the electronics module 170, heat is conducted from the surface of the module into the chamber and transferred from the inner wall surface of the thermal spreader to the liquid by the process of boiling. Bubbles emanating from the boiling section rise and induce a flow circulation from the boiling section to the condensing section 150. The array of pin fins provided within the condensing section and the vapor expansion section form augmented condensation surfaces in terms of total surface area available for condensation heat transfer. These internal pin fins are maintained in good thermal communication with the array of heat ejection pin fins extending from the outer surface of the thermal spreader, for example, by means of a thin thermally conductive wall of the thermal spreader. A forced air flow is provided over the heat ejection pin fins to reject the total cooled electronic assembly heat load to the surrounding environment, and thereby maintain the inner pin fins below the condensation temperature of the liquid for the subatmospheric pressure within the thermal spreader chamber. Condensation of vapor bubbles will occur both in the expansion/vapor section 160 and in the submerged portion of the condensing section 150.

Typically, the height of the expansion space will be less than that of the submerged section restricting the available condensing area in the vapor expansion section. This apparent restriction can be offset by making the internal pin fins 106b longer in this region to take advantage of the higher heat transfer coefficients which occur for condensation on fins in the free vapor space compared to condensation on fins in the submerged liquid of the condensing section 150. As vapor bubbles condense on the pin fins within the chamber, the denser liquid condensate drops to the bottom of the condenser section with the help of gravity and returns to the boiler section 140. Because of the relatively high heat transfer coefficients associated with the boiling and condensation phase change processes, the apparent thermal resistance from the boiling to the condensing surfaces within the thermal spreader chamber will be small, and the temperatures at the base of the heat ejection pin fins will be much more uniform than would be the case with a conventional heat sink with a solid metal base such as shown in FIG. 1. Further, use of the boiling phase change process such as described accommodates higher heat loads than possible using a conventional air cooled heat sink such as depicted in FIG. 1.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:

a thermal spreader having an inner chamber at least partially filled with a liquid;

a phase separator disposed within the thermal spreader and at least partially dividing the inner chamber into a boiling section and a condensing section, and a vapor expansion section disposed within the inner chamber of the thermal spreader, wherein the phase separator and the vapor expansion section allow vapor and liquid to circulate between the boiling section and the condensing section;

a heat extraction assembly disposed at least partially within the vapor expansion section and within the condensing section of the inner chamber, wherein the heat extraction assembly extracts heat from the vapor expansion section to facilitate condensing of vapor within the inner chamber to liquid and extracts heat from liquid within the condensing section to further cool the liquid before the liquid circulates to the boiling section; and wherein when the thermal spreader of the cooling system is coupled to a heat generating component with the boiling section thereof disposed adjacent to the heat generating component, liquid within the thermal spreader boils in the boiling section, producing vapor which leaves the boiling section and causes liquid to flow into the boiling section from the condensing section, thereby providing circulatory vapor and liquid flow between the boiling section and the condensing section and facilitating removal of heat from the heat generating component.

2. The cooling system of claim 1, wherein the heat extraction assembly comprises fins disposed within the inner chamber, the fins facilitating condensation of vapor to liquid within the inner chamber.

3. The cooling system of claim 2, wherein the fins comprise pin fins disposed within the inner chamber of the thermal spreader, the pin fins residing in at least one of the condensing section and the vapor expansion section of the inner chamber.

4. The cooling system of claim 3, wherein the heat extraction assembly further comprises heat ejection pin fins extending from a surface of the thermal spreader and disposed outside of the thermal spreader.

5. The cooling system of claim 4, further comprising air flow means for inducing air flow across the heat ejection pin fins extending from the thermal spreader.

6. The cooling system of claim 4, wherein the pin fins within the inner chamber extend through the surface of the thermal spreader to comprise the heat ejection pin fins extending from the surface of the thermal spreader.

7. The cooling system of claim 1, wherein when the thermal spreader of the cooling system is coupled to the heat generating component, the thermal spreader is disposed with a center axis thereof aligned within a range of ±10° of a vertical orientation.

8. The cooling system of claim 7, wherein the thermal spreader has a main surface with a surface area larger than a surface area of a surface of the heat generating component to which the thermal spreader is to be coupled.

9. The cooling system of claim 7, wherein when the thermal spreader of the cooling system is coupled to the heat generating component, the heat generating component is aligned to a lower region of the thermal spreader.

10. The cooling system of claim 1, wherein the heat generating component comprises at least one of an electronics device and an electronics module.

11. The cooling system of claim 1, wherein pressure within the inner chamber is lower than atmospheric pressure surrounding the cooling system.

12. A cooling system comprising:

a thermal spreader having an inner chamber at least partially filled with a liquid;

a phase separator disposed within the thermal spreader and at least partially dividing the inner chamber into a boiling section and a condensing section, wherein the phase separator allows vapor and liquid to circulate between the boiling section and the condensing section;

a heat extraction assembly disposed at least partially within the inner chamber of the thermal spreader to extract heat therefrom, thereby facilitating condensation of vapor within the inner chamber to liquid;

wherein when the thermal spreader of the cooling system is coupled to a heat generating component with the boiling section thereof disposed adjacent to the heat generating component, liquid within the thermal spreader boils in the boiling section, producing vapor which leaves the boiling section and causes liquid to flow into the boiling section from the condensing section, thereby providing circulatory vapor and liquid flow between the boiling section and the condensing section and facilitating removal of heat from the heat generating component;

wherein the heat extraction assembly comprises fins disposed within the inner chamber, the fins facilitating condensation of vapor to liquid within the inner chamber, and the fins residing in at least one of the condensing section and a vapor expansion section of the inner chamber; and wherein at least some fins within the inner chamber of the thermal spreader have different lengths within the chamber.

13. The cooling system of claim 12, wherein the fins reside in both the condensing section and the vapor expansion section, with the fins disposed within the vapor expansion section being longer than the fins disposed within the condensing section of the inner chamber.

14. A cooled electronics assembly comprising:
an electronics device or module having a main surface;
a cooling system coupled to the main surface of the electronics device or module, said cooling system comprising:
  a thermal spreader having an inner chamber at least partially filled with a liquid;
  a phase separator disposed within the thermal spreader and at least partially dividing the inner chamber into a boiling section and a condensing section, and a vapor expansion section disposed within the inner chamber of the thermal spreader, wherein the phase separator and the vapor expansion section allow vapor and liquid to circulate between the boiling section and the condensing section;
  a heat extraction assembly disposed at least partially within the vapor expansion section and within the condensing section of the inner chamber, wherein the heat extraction assembly extracts heat from the vapor expansion section to facilitate condensing of vapor within the inner chamber to liquid and extracts heat from liquid within the condensing section to further cool the liquid before the liquid circulates to the boiling section; and
  wherein the boiling section of the thermal spreader is disposed adjacent to the electronics device or module, and liquid within the thermal spreader boils in the boiling section with operation of the electronics device, producing vapor which leaves the boiling section and causes liquid to flow into the boiling section from the condensing section, thereby providing circulatory vapor and liquid flow between the boiling section and the condensing section and facilitating removal of heat from the electronics device or module.

15. The cooled electronics assembly of claim 14, wherein the heat extraction assembly comprises fins disposed within the inner chamber, the fins facilitating condensation of vapor to liquid within the inner chamber.

16. The cooled electronics assembly of claim 15, wherein the fins comprise pin fins disposed within the inner chamber of the thermal spreader, the pin fins residing in at least one of the condensing section and the vapor expansion section of the inner chamber.

17. The cooled electronics assembly of claim 16, wherein the heat extraction assembly further comprises heat ejection pin fins extending from a surface of the thermal spreader and disposed outside of the thermal spreader.

18. The cooled electronics assembly of claim 17, further comprising air flow means for inducing air flow across the heat ejection pin fins disposed outside the thermal spreader.

19. The cooled electronics assembly of claim 14, wherein the thermal spreader of the cooling system coupled to the electronics device or module has a center axis aligned within a range of ±10° of a vertical orientation.

20. The cooled electronics assembly of claim 14, wherein pressure within the inner chamber is lower than atmospheric pressure surrounding the cooling system.

21. A cooled electronics assembly comprising:
an electronics device or module having a main surface;
a cooling system coupled to the main surface of the electronics device or module, said cooling system comprising:
  a thermal spreader having an inner chamber at least partially filled with a liquid;
  a phase separator disposed within the thermal spreader and at least partially dividing the inner chamber into a boiling section and a condensing section, wherein the phase separator allows vapor and liquid to circulate between the boiling section and the condensing section;
  a heat extraction assembly disposed at least partially within the inner chamber of the thermal spreader to extract heat therefrom, thereby facilitating condensing of vapor within the inner chamber to liquid;
  wherein the boiling section of the thermal spreader is disposed adjacent to the electronics device or module, and liquid within the thermal spreader boils in the boiling section with operation of the electronics device, producing vapor which leaves the boiling section and causes liquid to flow into the boiling section from the condensing section, thereby providing circulatory vapor and liquid flow between the boiling section and the condensing section and facilitating removal of heat from the electronics device or module;
  wherein the heat extraction assembly comprises fins disposed within the inner chamber, the fins facilitating condensation of vapor to liquid within the inner chamber; and
  wherein the fins reside in both the condensing section and a vapor expansion section, with the fins disposed in the vapor expansion section being longer than the fins disposed within the condensing section of the inner chamber.

22. A method of fabricating a cooling system for a heat generating component, said method comprising:
providing a thermal spreader having an inner chamber and a phase separator disposed therein, the phase separator at least partially dividing the inner chamber into a boiling section and a condensing section, with a vapor expansion section being disposed within the inner chamber at one end of the phase separator, wherein the vapor expansion section and the phase separator allow vapor and liquid to circulate between the boiling section and the condensing section, the thermal spreader further including a heat extraction assembly disposed at least partially within the vapor expansion section and within the condensing section of the inner chamber, wherein the heat extraction assembly extracts heat from the vapor expansion section to facilitate condensing of vapor within the inner chamber to liquid and extracts heat from liquid within the condensing section to further cool the liquid before the liquid circulates to the boiling section;

at least partially evacuating the inner chamber and at least partially backfilling the inner chamber with a liquid; and wherein when the thermal spreader of the cooling system is coupled to a heat generating component with the boiling section thereof disposed adjacent to the heat generating component, liquid within the thermal spreader boils in the boiling section, producing vapor which leaves the boiling section and causes liquid to flow into the boiling section from the condensing section, thereby providing circulatory vapor and liquid flow between the boiling section and the condensing section and facilitating removal of heat from the heat generating component.

23. The method of claim 22, wherein the at least partially evacuating comprises producing subatmospheric pressure within the inner chamber of the thermal spreader with the liquid at least partially filling the inner chamber, thereby facilitating boiling of the liquid within the inner chamber at a lower temperature than at atmospheric pressure.

24. The method of claim 22, wherein the heat extraction assembly comprises fins disposed within the inner chamber, the fins facilitating condensation of vapor to liquid within the inner chamber.

25. The method of claim 24, wherein the fins comprise pin fins disposed within the inner chamber of the thermal spreader, the pin fins residing in at least one of the condensing section and the vapor expansion section of the inner chamber.

26. The method of claim 25, wherein the heat extraction assembly further comprises heat ejection pin fins extending from an outer surface of the thermal spreader.

27. The method of claim 26, further comprising providing air flow across the heat ejection pin fins outside of the thermal spreader for facilitating dissipating of heat when the thermal spreader of the cooling system is coupled to a heat generating component.

28. A method of cooling an electronics device or module comprising:

providing a cooling assembly, the cooling assembly comprising:
   a thermal spreader having an inner chamber at least partially filled with a liquid;
   a phase separator disposed within the thermal spreader and at least partially dividing the inner chamber into a boiling section and a condensing section, and a vapor expansion section disposed within the inner chamber of the thermal spreader, wherein the phase separator and the vapor expansion section allow vapor and liquid to circulate between the boiling section and the condensing section; and
   a heat extraction assembly disposed at least partially within the vapor expansion section and within the condensing section of the inner chamber, wherein the heat extraction assembly extracts heat from the vapor expansion section to facilitate condensing of vapor within the inner chamber to liquid and extracts heat from liquid within the condensing section to further cool the liquid before the liquid circulates to the boiling section; and coupling the cooling system to a main surface of the electronics device or module, with the electronics device or module disposed adjacent to the boiling section of the thermal spreader, wherein liquid within the thermal spreader boils in the boiling section with operation of the electronics device or module, thereby producing vapor which leaves the boiling section and causes liquid to flow into the boiling section from the condensing section, thereby providing circulatory vapor and liquid flow between the boiling section and the condensing section and facilitating removal of heat from the electronics device or module.

29. The method of claim 28, further comprising disposing the cooling system so that a center axis of the cooling system is aligned within a range of ±10° to a vertical orientation, thereby allowing gravity to facilitate circulation of the liquid flow between the condensing section and the boiling section.

30. The method of claim 28, wherein the heat extraction assembly comprises pin fins disposed within the inner chamber of the thermal spreader residing in both the condensing section and the vapor expansion section of the inner chamber, and wherein the heat extraction assembly further comprises heat ejection pin fins extending from an outer surface of the thermal spreader.

* * * * *

UNITED STATES PATENT AND TRADEMARK OFFICE
CERTIFICATE OF CORRECTION

PATENT NO. : 6,820,684 B1
DATED : November 23, 2004
INVENTOR(S) : Chu et al.

It is certified that error appears in the above-identified patent and that said Letters Patent is hereby corrected as shown below:

<u>Title page,</u>
Item [75], Inventors, delete the name "Micheal" and insert -- Michael --

Signed and Sealed this

Second Day of August, 2005

JON W. DUDAS
*Director of the United States Patent and Trademark Office*